United States Patent [19]

Fletcher et al.

[11] Patent Number: 4,513,855
[45] Date of Patent: Apr. 30, 1985

[54] SUBSTRATE ELEVATOR MECHANISMS

[75] Inventors: Ivan M. Fletcher, Clay Township, Hamilton County; Gary W. Gladish, Buck Creek Township, Hancock County, both of Ind.

[73] Assignee: AT&T Technologies, Inc., New York, N.Y.

[21] Appl. No.: 447,347

[22] Filed: Dec. 6, 1982

[51] Int. Cl.³ .................. B65G 25/00; B65G 65/02
[52] U.S. Cl. ................................ 198/473; 198/486; 414/416
[58] Field of Search ............ 198/342, 473, 477, 486, 198/680, 485; 414/222, 403, 416, 417; 204/298; 118/730

[56] References Cited

U.S. PATENT DOCUMENTS

| | | | |
|---|---|---|---|
| 1,025,853 | 5/1912 | Bartholomew | 198/680 |
| 1,994,646 | 3/1935 | Heath | 198/477 |
| 2,166,381 | 7/1939 | Taylor et al. | 198/680 |
| 2,868,354 | 1/1959 | Harrison | 198/477 |
| 3,033,345 | 5/1962 | Prymek | 198/473 |
| 4,336,875 | 6/1982 | Minnetti | 198/486 |

*Primary Examiner*—Joseph E. Valenza
*Assistant Examiner*—David A. Bucci
*Attorney, Agent, or Firm*—R. F. Kip, Jr.

[57] ABSTRACT

The development is an improved elevator hook forming part of an elevator for transferring ceramic substrates in a tray between a magazine and a stepwise indexable rotatable cage in a sputtering chamber. The improved hook has a vertical shank, a vertical arm disposed on one side of the shank and pivotally coupled thereto, a laterally salient horizontal elevator member disposed at the lower end of the arm for supporting the tab of such a tray, a horizontal retainer member laterally and vertically opposite the elevator member and transversely offset therefrom, and a spring urging the elevator member towards the retainer member. The gap is normally small enough to prevent a tray tab dislodged from the elevator member from falling through the gap. The tray tab is placed on the elevator member by causing the gap to open up, under force from a tray lug pressed against the members at one end of the gap, to a width sufficient to permit the lug to pass laterally through the gap to its other end at which the tray tab is deposited on the elevator member. Other features are that the gap at its entrance end has a flared entrance, and that the tray tab is rounded and is seated on the elevator member in a groove of such configuration that there is developed a horizontal force component tending to retain the tab in the groove.

2 Claims, 20 Drawing Figures

"X" CAGE INDEX

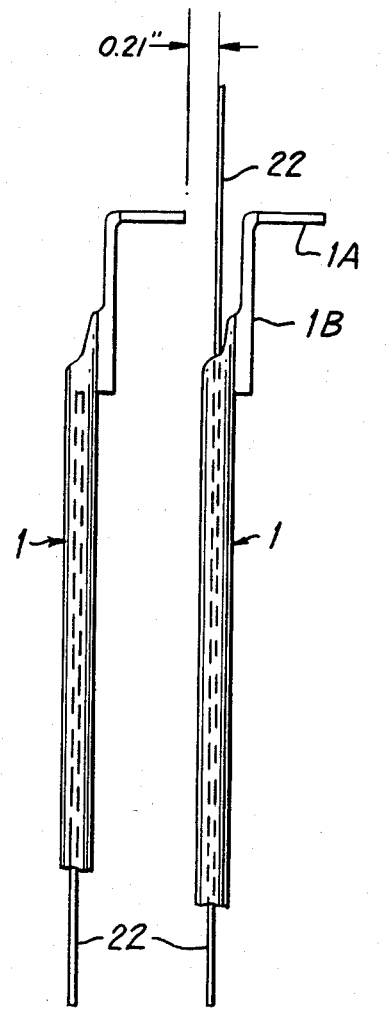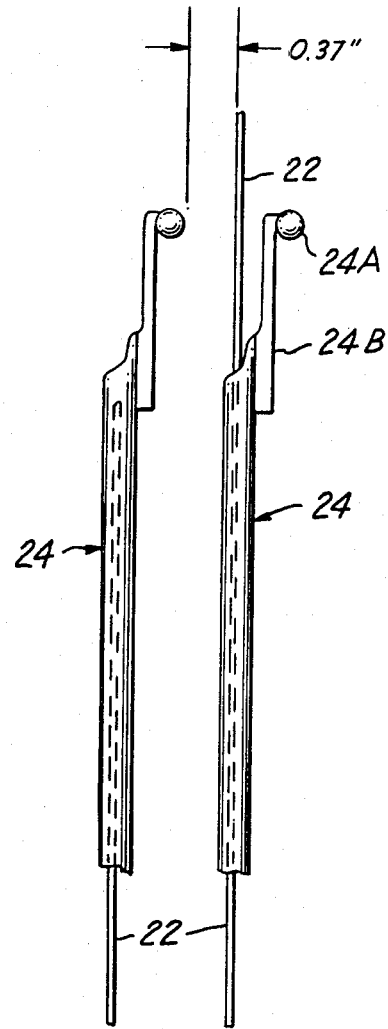
PRIOR ART
FIG. 9A
FIG. 9B

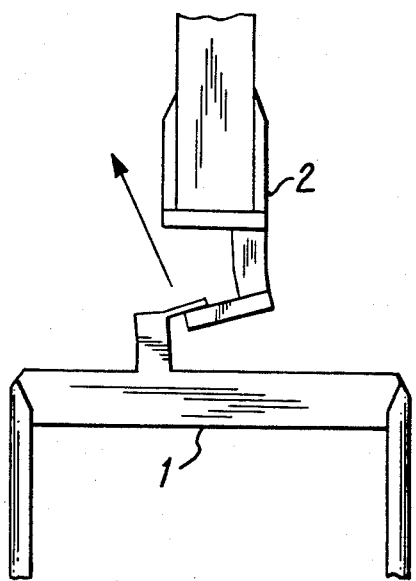
PRIOR ART
FIG. 10A
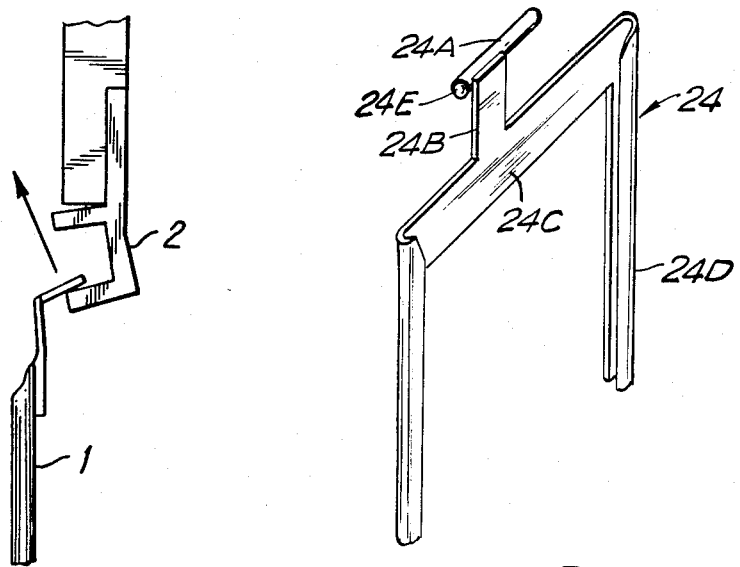
PRIOR ART
FIG. 10B
FIG. 11

SUBSTRATE ELEVATOR MECHANISMS

TECHNICAL FIELD

This invention relates generally to elevator mechanisms useful in manufacturing for transferring items from one place to another. More particularly, this invention relates to elevator mechanisms of such kind for transferring ceramic substrates from a magazine therefor to a sputtering chamber and, after completion of sputtering, from such chamber back to a magazine.

BACKGROUND OF THE INVENTION

In the manufacture of thin film integrated circuits, substrates in the form of rectangular ceramic wafers are (1) transferred from a magazine into a sputtering chamber within which a thin coating of metal is sputtered onto the substrates, (2) transferred on completion of the sputtering back to a magazine and then (3) processed by the use of photolithographic and other techniques to convert such coated substrates into such circuits.

Sputtering of the metal coating onto the substrates is effected within the method chamber by: maintaining a vacuum therein and providing therein a negatively charged sputtering cathode which ionizes the rarefied argon atmosphere which, in turn, erodes the metal cathode causing such metal to be deposited on the substrates, and exposing the substrates to such deposition for a predetermined time so as to render the metal coating thereon of a predetermined desired thickness. Such fixed time of exposure is obtained by positioning the substrates at the sides of a polygonal stepwise-rotatable cage in the chamber, and by indexing the cage step-by-step so as to move the substrate in the chamber for a fixed time along a fixed length path which begins at a transfer station at which the uncoated substrates originally enter the chamber, and which closes on itself to eventually return to such stations from which the now coated substrates are then removed from such chamber. An elevator mechanism is commonly used for conveying uncoated substrates to the chamber from a magazine and for conveying the coated substrates fron the chamber back to a magazine.

The original cylindrical sputtering machines made use of two elevators. The lower elevator pushed the tray up from the main chamber into the sputtering chamber and supported the tray as the cage indexed. The upper elevator pushed the tray down from the sputtering chamber into the magazine in the lower chamber. As an improvement, cylindrical sputtering machines developed earlier by others have made use of only one elevator in which the functions of the two previous elevators were combined. The single elevator design simplified maintenance and improved reliability. It too, however, had its shortcomings resulting from the elevator and tray tab and other designs.

SUMMARY OF THE INVENTION

Such shortcomings are avoided according to the invention in one of its aspects by providing a vertical elevator hook equipped at its lower end, with lateral elevator and retainer tabs extending horizontally generally parallel to each other and spaced apart by a transverse gap extending laterally through the hook. One or the other of the elevator and retainer tabs is pivotally coupled to the shank of the hook to be relatively movable towards and away from the other tab so as to render the size of said gap variable between completely closed, or almost so, and wide open; and spring means is used to normally maintain the gap at its smallest size. In use, the hook's elevator tab engages the underside of the tab of a tray which includes also a vertical substrate-carrying frame below such tab and joined thereto by a vertical lug, the hook by such engagement being adapted to move the tray vertically for purposes of transferring one or more substrates between a magazine and the mentioned chamber. During such engagement, the gap between the elevator and retainer tabs is at smallest size so that, if the tray tab becomes dislodged from the elevator tab, the tray cannot fall through the gap and thereby become separated from the hook. Before such engagement takes place, however, it is necessary for there to take place a passage from one to the other of the lateral sides of the hook and through the mentioned gap of the tray of greater transverse dimension than the gap at its smallest size. Such passage is effected, however, by having the gap forced open by the lug against the bias of the spring means to a gap width permitting the lug to laterally move therethrough.

According to the invention in another of its aspects, the entrance for the lug into the mentioned gap is flared to facilitate the forcing apart of the sides of the gap to a width therebetween permitting passage through the gap of the lug. As still another aspect of the invention, the tray tab may be in the form of a length of rod having a cylindrical underside, and the elevator tab may have formed in its upper side a substantially cylinderical groove which receives such underside to effect the engagement between the hook and the tray, and which is of greater radius than the rod so as to generate a horizontal component of force tending to keep the tray tab on the elevator tab.

The invention in many instances can best be comprehended by comparing its features with those of the one-elevator system earlier developed. Accordingly, the approach will be taken herein of first discussing such earlier system and then discussing the improvement thereof in accordance with the invention.

It should be appreciated that while, for convenience of disclosure, the discussion herein of the representative embodiment will be in terms of certain coordinate directions thereof, the invention as disclosed and claimed is not limited to any particular geometric orientation.

BRIEF DESCRIPTION OF DRAWINGS

For a better understanding of the invention, reference is made to the following description of a representative embodiment thereof and to the accompanying drawings wherein:

FIGS. 9A and 9B are schematic right side elevations illustrative of spacing relations between trays when unloaded from or loaded into the FIG. 2 magazine in the instances where the trays are of the old design (FIG. 9A) and the new design (FIG. 9B);

FIGS. 10A and 10B are schematic diagrams illustrative of bending of parts of the old design tray and hook;

FIG. 11 is an isometric view of the new design tray;

DETAILED DESCRIPTION OF EMBODIMENT

Figure 1:
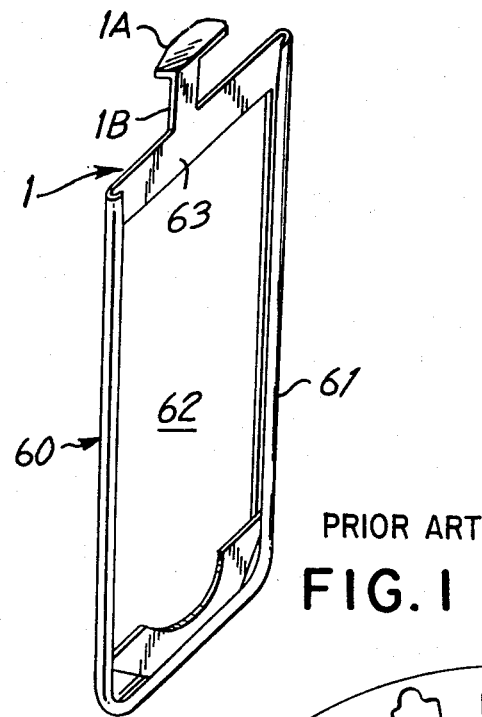
FIG. 1 is an isometric view of a substrate tray having a tray tab of the old design.
Figure 7:
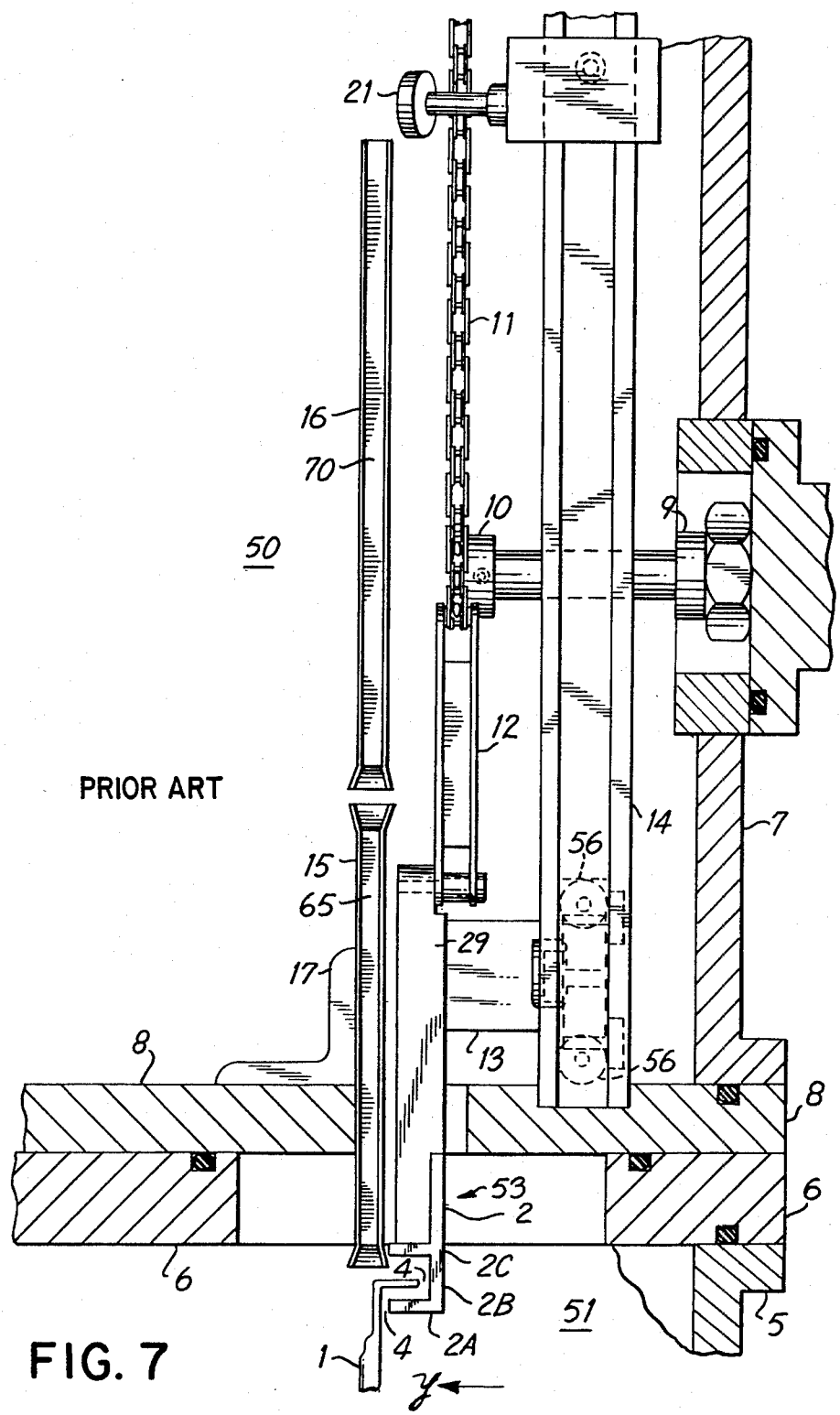
FIG. 7 is a right side elevation of the FIG. 6 ensemble plus part of said cage, portions of the FIG. 7 ensemble being sectioned or broken away to clarify the showing.

Cylindrical sputtering machines have two large chambers 50 and 51 (FIG. 7). The uppermost and slightly smaller chamber 50 is where the deposition occurs and is called the sputtering chamber. In this chamber, the trays 1 (see FIG. 1) (each tray holding two $4\frac{1}{2}''\times 3\frac{3}{4}''$ substrates) are arrayed in a sixteen sided regular polygon or cage 16 (FIG. 8) (one tray per side) around the cathode (not shown).

Figure 2:
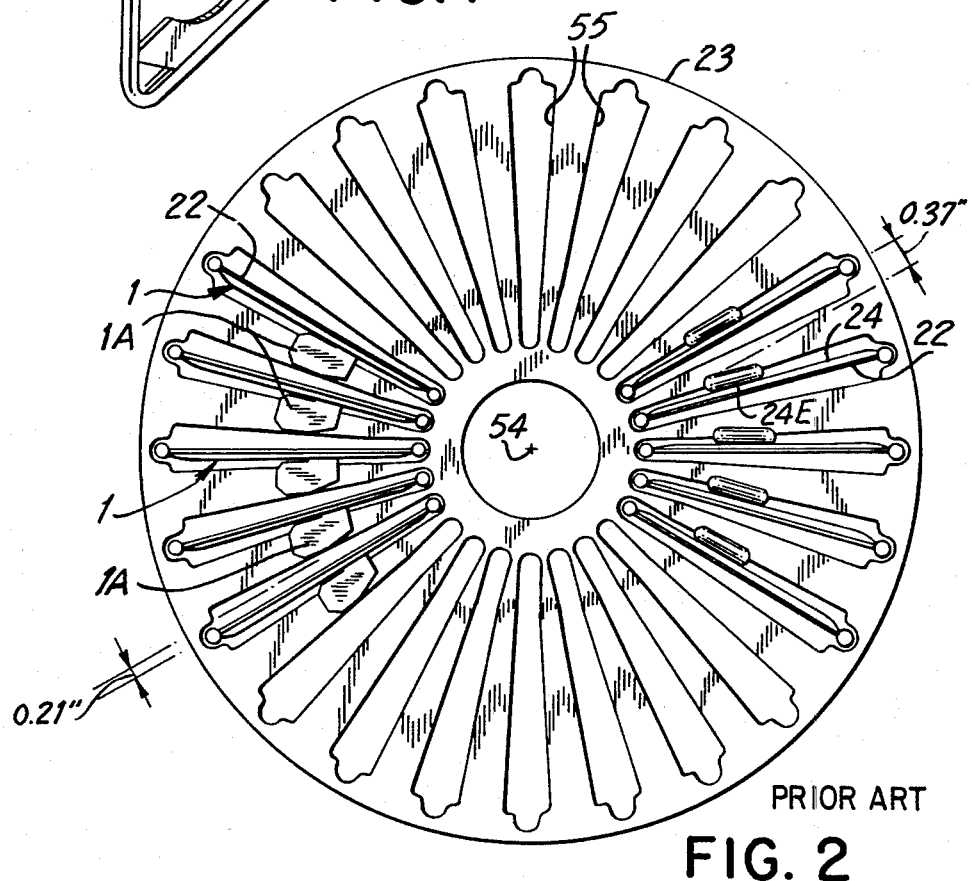
FIG. 2 is a schematic plan view of a magazine for substrate trays, the magazine being shown as partly loaded with trays having tabs of the old design and trays having tabs of the new design.
Figure 3:
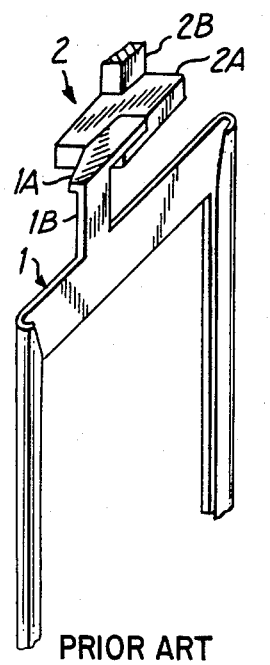
FIG. 3 is an isometric view of the FIG. 1 old design tray as engaged by a hook of the old design, only part of such hook being shown.

The lower and slightly larger chamber is called the main chamber. Its function, along with the load lock (a small, separately sealable chamber integral to the main chamber and not shown), is to bring into and out of the vacuum of the sputtering facility as many substrates as possible in a given time period. In this main chamber, the trays are carried in radial open-topped slots 55 in magazines 23 (FIG. 2). Each magazine carries twenty-four trays arranged radially around the vertical axis 54 of the magazine.

Figure 4:
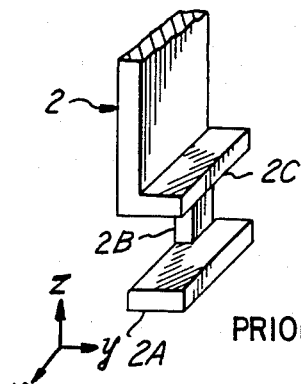
FIG. 4 is an isometric view showing further details of the FIG. 2 hook.
Figure 5C:
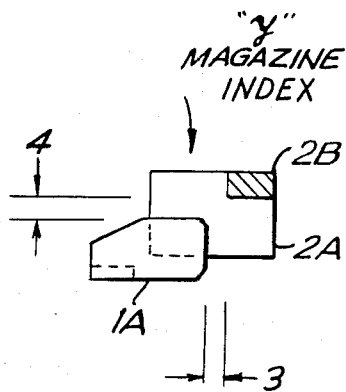
FIGS. 5A, 5B and 5C are schematic views of the FIG. 1 tray and FIG. 4 hook, those views being respectively a front elevation, right side elevation and plan view in cross-section, the latter being taken as indicated by the arrows 5C—5C in FIG. 5A.
Figure 5C:
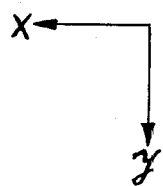
Figure 5A:
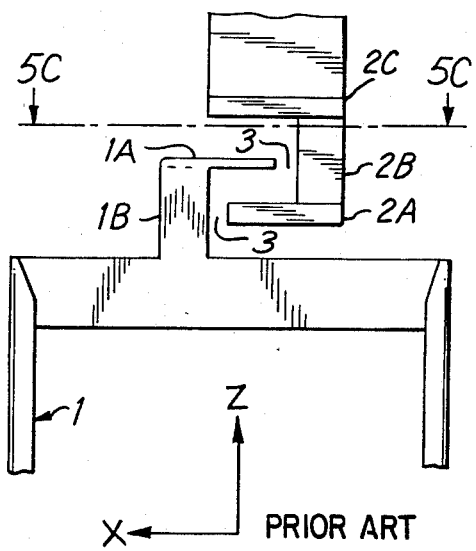
Figure 5B:
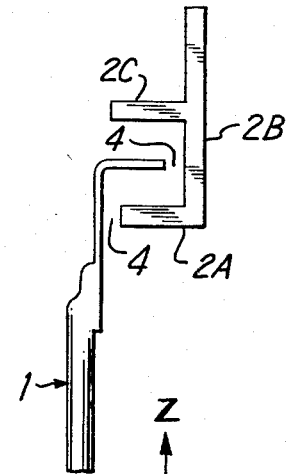
Figure 6:
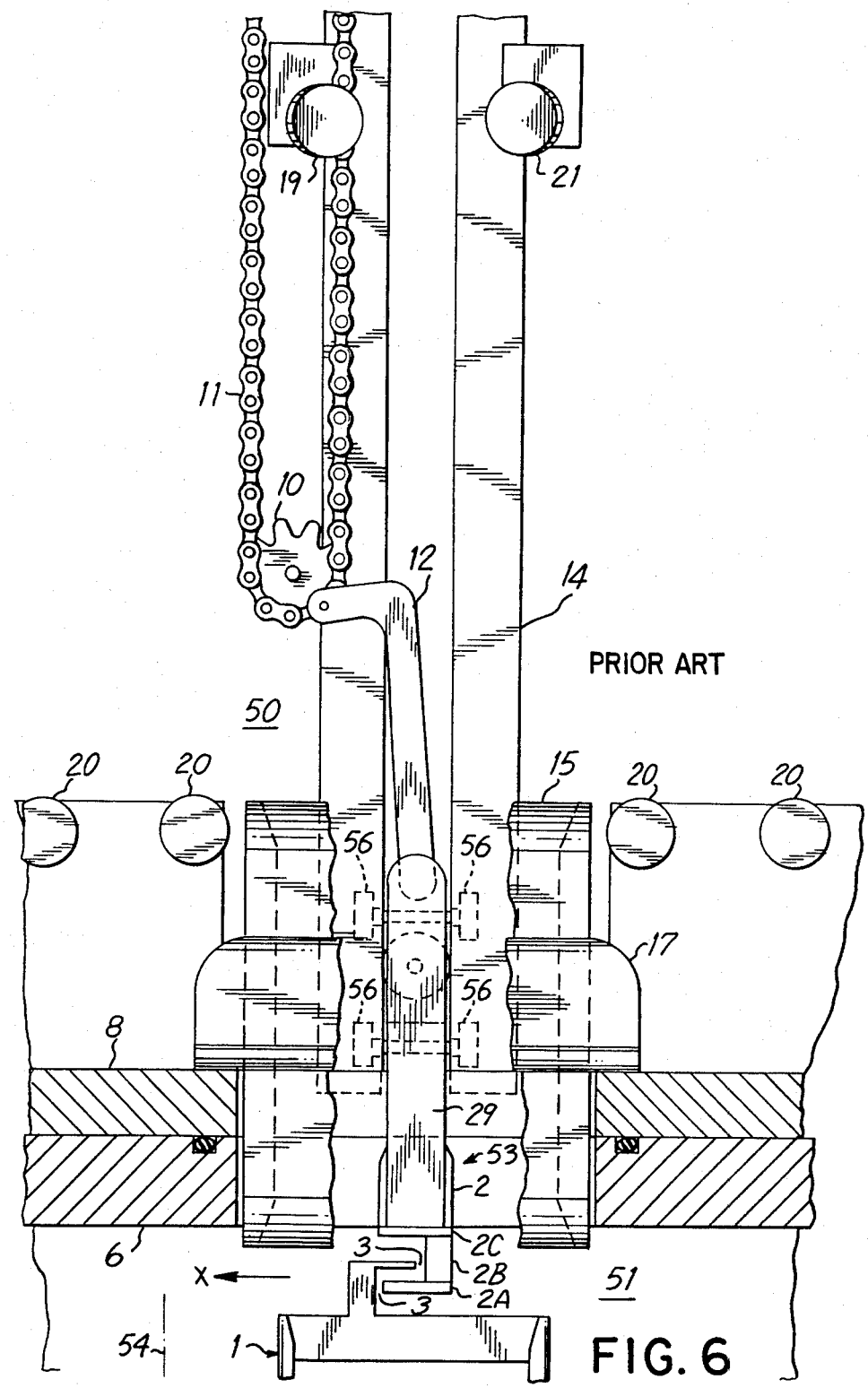
FIG. 6 is a front elevation of an ensemble comprising the lower part of an elevator mechanism for a substrate sputtering facility and part of such facility excluding the sputtering chamber cage, the FIG. 1 tray and FIG. 4 hook being shown, and portions of the ensemble being sectioned or broken away to clarify the showing.

The function of the elevator 53 (FIGS. 6, 7, 8) is to lift at a lower transfer station a tray of fresh product out of the magazine in the main or lower chamber up to an upper transfer station and into the cage in the sputter chamber, support it while the cage indexes once about its vertical axis, and then push a tray, of sputtered substrates down out of the cage and into the magazine below. Then the magazine indexes and the cycle starts again. To accomplish this, an elevator tab has been devised that effects movement of the tray in the "z" direction (up and down) but leaves the tray free to move in the lateral or "x" direction (cage index) and the transverse or "y" direction (magazine index) (see FIGS. 4 and 5).

With the elevator in the down position (see FIGS. 6 and 7), the tray 1 sits in the magazine 23 (FIG. 2) which is the main chamber. The main chamber 51 is bounded by the main chamber cylinder 5, the main chamber top plate 6, a bottom plate (not shown), and several peripheral attachments. The sputter chamber 50 is bounded by the sputter chamber cylinder 7, and the sputter chamber bottom plate 8, a top plate (not shown), and peripheral attachments.

An elevator drive motor (not shown) is located outside the vacuum chambers. Torque from the drive motor is fed through the wall of the sputtering chamber by a ferro-fluidic vacuum rotary feedthrough 9 to a chain drive sprocket 10. The drive sprocket 10 drives endless belt conveyor means in the form of the chain 11 which drives the connecting web 12 which drives the elevator dolly 13 and elevator dolly arm 29. An elevator hook 2 is attached to the elevator dolly arm 29. The rollers 56 on the elevator dolly 13 ride inside channels in the elevator column 14 which serves as a guide to keep the hook 2 aligned.

The old design tray 1 (FIG. 1) comprises a vertically oriented frame 60 including a channel member 61 which is of U-cross section in planes normal to its centerline, and which is bent into the form of a rectangular "U" to outline a receptacle space 62 of the same shape. The upper ends of member 61 are joined by a horizontal cross-piece 63 to which is joined a lug 1B projecting upwards from frame 60 and disposed nearer to its left hand side than to its right hand side. Attached to the top of lug 1B is a flat tray tab 1A. In use, substrates 22 are slipped down into the U-grooves provided by member 61 on opposite sides of frame 60 so as to be held by that member in receptacle space 62. Preferably, there are two of such substrates although, if desired, the frame may accommodate only one long substrate.

With the elevator in the down position, a tray 1 with an old design tab 1A has such tab positioned between lower and upper elevator tabs 2A and 2C on the hook 2. The clearance 3 (see FIG. 5C) between tray tab 1A and the stem 2B of the elevator tab allows the magazine to index (motion in the "y" direction). When the magazine indexes, it moves 15° around its axis (1/24th revolution) bringing a new tray into position over the elevator tab.

As the elevator rises from the lowermost position (FIGS. 6 and 7), the lower elevator tab 2A contacts the tray tab 1A and lifts the tray 1 out of the magazine, through the intermediate track 15, and into the cage 16. With the elevator in the up position (see FIG. 8), the clearance 4 (see FIG. 5C) allows the cage to index with the tray tab 1A passing past the upright 2B on the elevator tab (motion in the "x" direction).

Intermediate track 15 (FIGS. 7 and 8) comprises two laterally spaced vertical U-Channel members 65 fixedly coupled to the plate 8 by bracket 17 and disposed to have their U-grooves facing each other and spaced apart by slightly more than the lateral width of tray 1. In the course of the tray's upward movement towards cage 16 (or back down from such cage after it has completed one revolution), the laterally opposite sides of the tray are received in these grooves so that the tray is guided in such movement by track 15.

The cage 16 comprises (FIGS. 7 and 8) sixteen channel chambers 70 each of H-cross section in planes normal to their centerlines and secured at their tops to a circular rim 71 around which channel members 70 are equidistantly spaced to form a sixteen-sided polygon. The spacing between each two adjacent channel members 70 is slightly greater than the lateral width of each tray 1. Accordingly, each two such adjacent members provide by the grooves of their H-sections which face each other a receptacle for receiving and holding a substrate tray at a location at one of the sides of cage 16 such that the tray travels with the cage as it is indexed. That is, the channel members 70 constitute means responsive to the indexing of the cage for correspondingly laterally displacing forward the tray 1 held thereby so that the travel in each index step of the cage and tray are the same.

When the cage 16 starts to index (see FIG. 8), the tray 1 is supported by the lower elevator tab 2A. Before the tray tab 1A slides off the lower elevator tab 2A, it contacts the lifting roller 19. The tray tab 1A rides up on and across the lifting roller 19 which supports the tray during part of the index. By the time the tray tab 1A clears the other side of the lifting roller 19, the bottom of the tray 1 is over the tray support rollers 20. Then the tray 1, held in place by the cage 16, rides around the cathode (not shown) on a series of support rollers 20 until it completes its circuit and approaches the elevator position from the other side. As the tray approaches the elevator position on its last index, the tray tab 1A contacts another lifting roller 21 which lifts the tray 1 off the support rollers 20 and then lowers the tray tab 1A down onto the lower elevator tab 2A.

Figure 8:
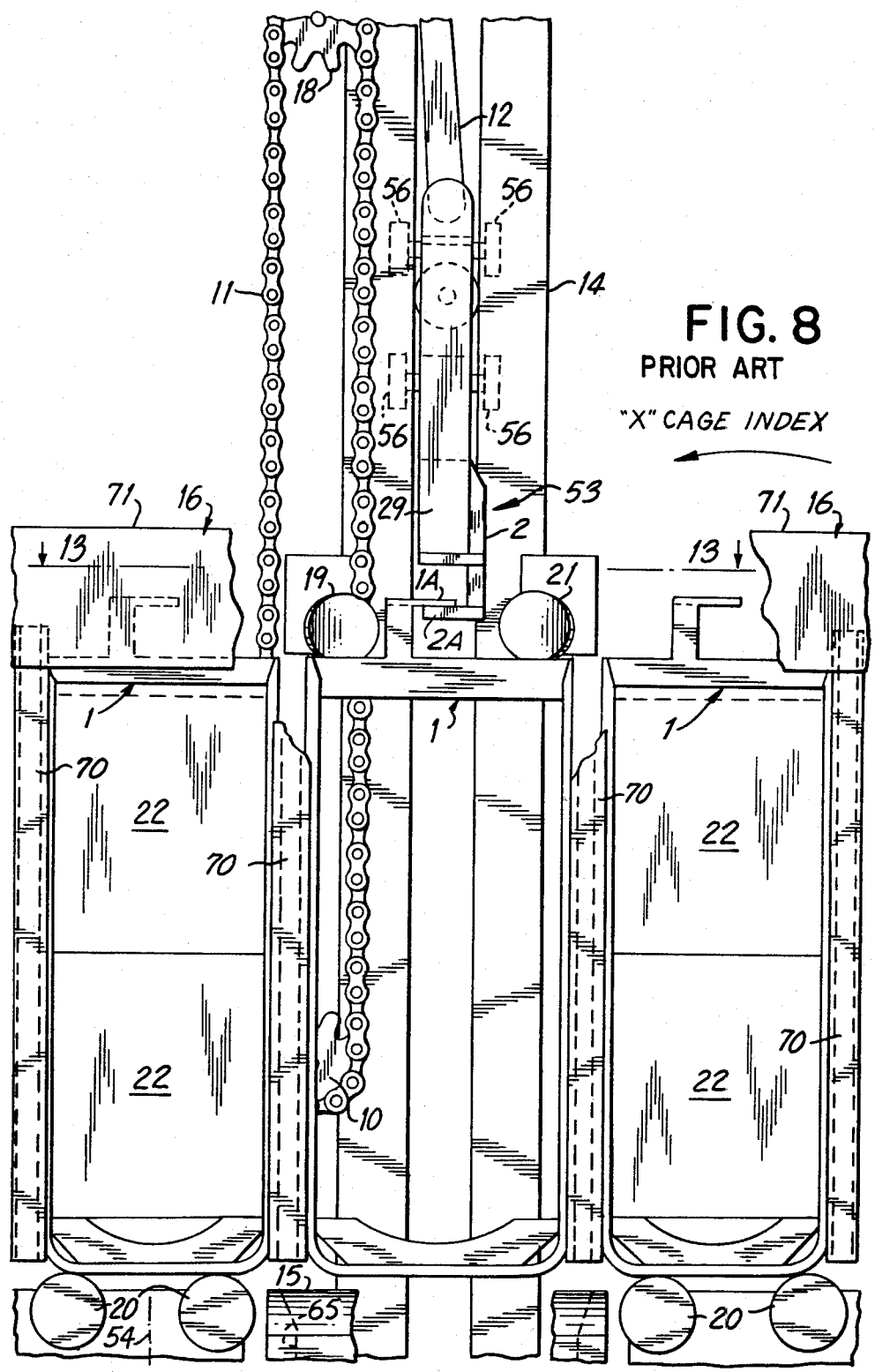
FIG. 8 is a front elevation of an ensemble comprising the upper part of the elevator mechanism and sputtering facility (including part of the sputtering chamber cage) of which the lower part of the ensemble is shown in FIG. 6; portions of the FIG. 8 ensemble being sectioned or broken away to clarify its showing.

The elevator then goes down pushing the tray 1 of sputtered product out of the cage 16, through the intermediate track 15, and into the magazine below. The magazine then indexes putting a new tray of product in position and the elevator raises it into the cage. In the described machine, the cage has, as stated, sixteen sides or locations. Each time the cage indexes the elevator goes down, taking a tray of sputtered product with it, and retrieves a new tray from the magazine below. Each tray 1 preferably (but not necessarily) holds two substrates 22. In FIG. 8, the substrates 22 are shown in the trays 1 on either side of the elevator, but have been removed from the tray in the elevator position to show more of the mechanical apparatus.

By reducing the number of moving parts, the single elevator design so far described is a substantial improvement over the earlier two-elevator designs. It too, however, has its shortcomings. Some of these shortcomings center on the design of the elevator and tray tabs and can be segregated into two categories: machine jams and film scratches.

FIG. 2 shows a simplified top view of a sputtering magazine 23. In FIG. 2, five of the old trays 1 are shown on the left side of the magazine and five of the new trays 24 are shown on the right side of the magazine. The remaining fourteen slots in the magazine have been left blank.

When the machine operator loads substrates into the trays or unloads substrates from the trays in the magazine, then the substrates 22 are moved vertically past the tray tab 1A on the adjacent tray (see FIGS. 9A and 9B). For the old tray, the normal distance between the adjacent tray tab and the film face of the substrate is only 0.21" (FIG. 9A). If the operator is not careful, the film face of the substrate can be scratched on the adjacent tray tab during loading and unloading.

The elevator moves the tray vertically from the magazine up into the cage and later lowers it vertically from the case down into the magazine. As long as both the tray tab and the elevator tab remain perfectly flat and horizontal, the only component of force that is transferred from the elevator to the tray is a straight vertical force. However, as soon as either tab becomes slightly bent, the transfer of force from elevator to tray tab picks up a horizontal component as shown in FIGS. 10A and 10B.

A horizontal component in the elevator force, as shown in FIGS. 10A and 10B, tends to make the tray lock up in the track as it tries to pass through the intermediate track 15 or a cage track between the cage members 70; it tends to separate the tray tab and elevator tab or decrease their overlap; and, most importantly, it tends to further bend the tabs and thus further increase the horizontal component of the force. Thus a small bend in the tab can quickly becomes a large bend in the tab. One of the more common causes of jams in the described machine are bent tray tabs which cause the tray to lock up in one or the other of such tracks or to fall off the elevator. Careful set up of the machine and inspection of the tabs helps to minimize such jams but such care is time consuming and not completely effective.

In the new tray design, the ½" wide flat tray tab 1A is replaced by a tray tab in the form of a portion of a 3/16" diameter round rod 24E (see FIG. 11). As shown in FIG. 11, rod 24E is joined to a lug 24B to one side thereof adjacent its top, and lug 24B is in turn joined to the crosspiece 24C of the vertically oriented frame 24D of the new tray 24 so as to project upwards from that frame and to be nearer its left hand than its right hand side. Rod 24E is horizontally salient from lug 24B in the direction away from the left hand side of the frame, the portion of the rod which provides the new tray tab 24A being rightward of lug 24B and transversely and laterally offset from such lug and of a length so as to extend past the vertical centerline of the new tray 24. Such new tray differs from the old tray (FIG. 1) principally by having the described smaller round tab. The smaller tab provided by the rod increases the normal clearance between the film face of the substrates and the tab of the adjacent tray from 0.21" to 0.37" (see FIGS. 9A and 9B) or nearly 75%. If we assume that a tray tab can commonly be bent by as much as 0.10", then the new tray tab changes the minimum expected clearance from 0.11" to 0.27" or an increase in minimum clearance of more than 130%. This increased clearance substantially reduces scratches at the load-unload operation.

Simply reducing the width of the tray tab 24A from ½" to 3/16" without other changes would reduce the overlap between the tray tab and the elevator tab to the point where even minute misalignment would allow the tray to fall off the elevator and cause a jam. This is prevented by several changes instituted in the elevator hook.

With regard to such changes, the improvements so far described are disclosed in a copending patent application filed in the name of Gary W. Gladish who is the sole inventor of such improvements. The description which follows pertains to the changes jointly developed by the applicants hereof.

Figure 12:
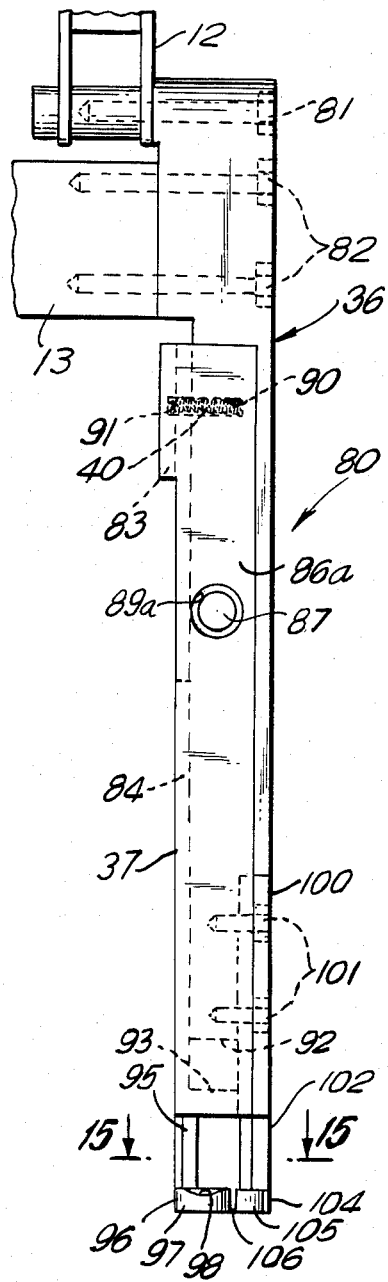
FIG. 12 is a left side elevation of the new design hook.

The new hook 80 (FIG. 12) comprises a generally vertical dolly arm or shank 36 pivotally coupled at its upper end by bolt 81 to connecting web 12 and fixedly coupled at such end by bolts 82 to the elevator dolly 13. Shank 36 has mounted thereon below its coupling with dolly 13 a vertical support arm 37 of rectangular "U" shape in horizontal cross section so as to consist (FIG. 14) of upper and lower vertical webs 83, 84 separated by a void 85, and of two laterally spaced vertically elongated parallel sides 86a, 86b joined at the back by the webs and projecting transversely forward therefrom. As shown in FIG. 12, arm 37 is disposed on the rear side of shank 36 and is pivotally coupled thereto by a pin 87 passing through a horizontal bore 88 (FIG. 13) in shank 36 and through horizontal holes 89a, 89b formed in the arm's side walls 86a, 86b and disposed (FIG. 14) within the vertical extent of void 85 and somewhat below its vertical midpoint. By virtue of such pivotal coupling, arm 37 is rockable in relation to shank 36 between a "closed" position at which web 84 bears against the rear of shank 36 and an "open" position at which the bottom of such web is retracted from the rear of such shank. Arm 37 is biased to closed position by spring means in the form of a compression spring 40 disposed above pivot pin 87 and having opposite ends received in recess holes 90, 91 formed in, respectively, the shank 36 and the web 83 of arm 37.

Support arm 37 extends below the bottom 92 of shank 36 and has towards its lower end (below such bottom) a crossbrace 93 extending between the lower ends of the sidewalls 86 of the arm. Joined to and extending downward from such crossbrace is a vertical stem 95 offset to the right (FIG. 14) of the vertical centerline of the arm. Stem 95 mounts at its lower end an elevator bar 96 horizontally salient from the stem and having leftward thereof a portion transversely and laterally offset from the stem and providing a lower elevator tab 97. Tab 97 has formed in its upper side a groove 98 extending (FIG. 15) inward from the left side of tab 97 to a termination short of the left hand edge of stem 95. The curved bottom surface of groove 98 preferably (but not necessarily) conforms to an arc of a cylinder, and such curved surface has a radius substantially greater than the radius of the cylindrical underside of the tray tab 24A. Thus, for example, the radius of groove 98 may be 0.344" as compared to the 0.0938" radius for such tray tab.

Figure 13:
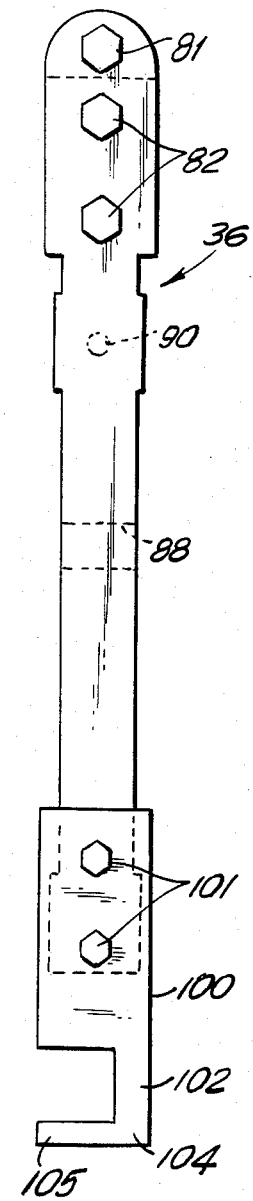
FIG. 13 is a front elevation of the dolly arm and tray retaining means of the FIG. 12 hook.
Figure 14:
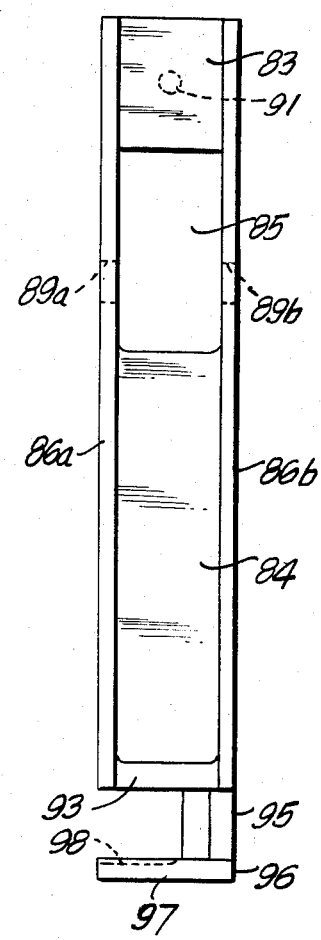
FIG. 14 is a front elevation of the rockable support arm, stem and elevator bar of the FIG. 12 hook.

The described downward extension 95, 96 of arm 37 is matched by a downward extension of shank 36 in the form of a retainer plate 100 (FIG. 13) having its upper end affixed by bolts 101 to the lower front side of the shank such that the plate fits into an inset formed in such side (FIGS. 12 and 13). The lower end of plate 100 is shaped to provide (i) a downstanding post 102 laterally disposed on the right side of the shank (FIG. 13) opposite (FIG. 15) the stem 95 which mounts the elevator bar 96, and (ii) a termination or tray retaining means 104 disposed at the lower end of post 102, and a part 105 of which extends horizontally leftward of post 102 (FIG. 15) and constitutes a tray retainer tab 105 positioned opposite elevator tab 97 to be spaced therefrom by a transverse gap 106 laterally extending through the elevator hook 80. Gap 106 has at its right hand end a flared entrance 107 provided by surfaces 108, 109 formed on, respectively, the elevator bar 96 and the retaining plate termination 104 and curving transversely from the inner sides of these elements (i.e., the sides thereof towards gap 106) to the outer sides thereof.

In use, the described new hook operates as follows. Assume to begin with that the elevator tab 97 of the hook is in engagement with a tray tab 24A so as to support beneath the hook a new design tray 24 (FIG. 11) which has substrates received and held within its frame 24. That is, hook 80 is coupled with tray 24 to effect vertical movement thereof between the upper and lower transfer stations of the described sputtering facility (FIGS. 6, 7, 8) for purposes of effecting transfer of the substrates from a magazine to a location at one of the sides of polygonal cage 16, or conversely. Now assume that, in the course of such a transfer, tray 24A becomes dislodged from elevator tab 97. At that time the force exerted by compression spring 40 (FIG. 12) on rockable support arm 37 is urging that arm to "closed" position at which the elevator tab 97 is advanced transversely as far as possible towards retainer tab 104 to reduce the transverse gap 106 therebetween to its smallest size. Such size may conveniently be 0.012" but can be zero. In those circumstances, the tray tab 24A is prevented by retainer tab 105 from passing downward through gap 106 and, accordingly, separation between the hook 80 and tray 24 is prevented.

Figure 15:
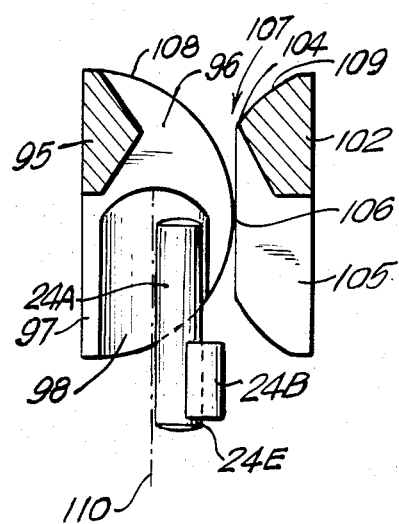
FIG. 15 is a plan view in cross-section, taken as indicated by the arrows 15—15 in FIG. 12, of the lower portion of the FIG. 12 hook.

It is, however, necessary not only for the hook 80 to move a tray 24 up and down (for purposes of effecting the described transfer of substrates) but also for the hook to be able to receive on its elevator tab 97 the tab 24A of a tray 24 which is being indexed by stepwise rotation of cage 16 from its last sputtering location to the elevator (preliminary to its being transferred back to a magazine), and which tray, accordingly, is initially positioned on the right hand side of the hook (FIG. 15) rather than on its left hand side as shown in FIG. 15. For such right hand position of the tray and its tray tab 24a, if the gap 106 between the elevator and retainer tabs 97 and 105 of the hook were to remain at its smallest size, the lug 24b of the tray could not pass laterally through the gap. In practice, however, what happens is that, as lug 24B is advanced into the flared entrance 107 of the gap, the lug bears against the curved surfaces 108 and 109 of the elevator bar 96 and the retainer termination 104 to be guided into gap 106 and to wedge bar 96 outwardly from part 104 to cause support arm 37 (FIG. 12) to rock about pivot pin 87 towards "open" position far enough to open gap 106 to a width permitting lug 24B of the tray to laterally pass therethrough (see FIG. 16). Further indexing of the cage effects such lateral passage and brings the tray to the position where its tray tab 24A is located as shown in FIG. 15, the gap 106 meanwhile having closed down again to its smallest size.

Figure 16:
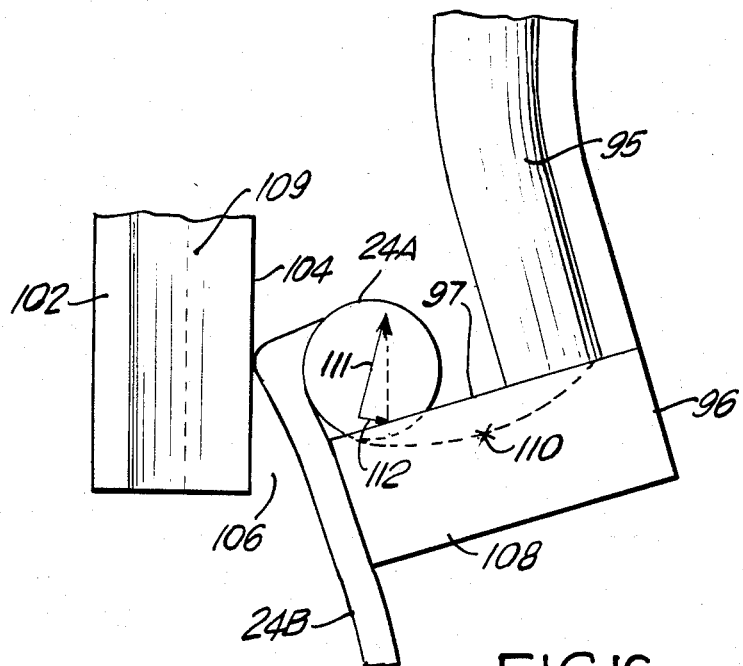
FIG. 16 is a schematic right side elevational view of the lower portion of the FIG. 12 hook in the course of passage between its elevator and retainer tabs of the tray lug; the stem supporting the elevator tab having previously been somewhat bent.

An additional feature inhibiting dislodgement of the tray tab 24A from the elevator tab is the cooperation between the rounded underside of the tray tab and the surface of the groove 98 in the elevator tab. As mentioned, the radius of the surface of such groove is greater than the radius of the surface of such underside such that any contact between the two surfaces will be a lateral line contact. When, as earlier described, the lug 24B of the tray passes laterally through gap 106, towards the end of such passage, the elevator tab 97 moves under the urging of spring 40 towards retainer tab 105 to ordinarily cause tray tab 24A to become disposed on the elevator tab in the position which is shown in FIG. 15, and for which the line contact between the tray tab and groove 98 is forward of the grooves transverse centerline 110 so that such contact is displaced towards retainer tab 105. When lug 24B is passing through gap 106 (FIG. 16), such line contact is temporarily shifted even more towards tab 105, and a similar shift may occur in the position of the line contact due to the fact that the stem 95 has become somewhat bent (as shown in FIG. 16), or from some other inadvertent cause. In any such case, because the surface of groove 98 with which the tray tab makes line contact is upwardly slanting in the direction towards retainer tab 105 at the location of the line contact, the upward supporting force 111 (FIG. 16) exerted by the groove's surface on the tray tab 24A will include a horizontal force component 112 extending to retain the tray tab on the elevator tab. It is only when the tray tab settles under gravity (or for some other reason) into the center of groove 98 (to have the tab's line contact with the groove coincide with the groove's centerline 110) that such horizontal force component disappears. In such latter instance, however, the tray tab is centrally placed on the elevator tab so that the stabilizing effect of the horizontal force component can be dispensed with since it would, if present, be superfluous.

The above described embodiment being exemplary only, it will be understood that additions thereto, omissions therefrom and modifications thereof can be made without departing from the spirit of the invention. For example, while numerous dimensions have been given for the representative embodiment described, the invention is not restricted to those dimensions or any one or more of them. Accordingly, the invention is not to be considered as limited save as is consonant with the recitals of the following claims.

What is claimed is:

1. An elevator mechanism for vertically transferring substrates between radial open-topped slots in a lower rotatable magazine and locations assigned to such substrates at the sides of an upper rotatable polygonal cage, said slots and locations being adapted by respective stepwise rotations of said magazine and cage about respective vertical axes therefor to by horizontally indexed transversely and laterally, respectively, past lower and upper transfer stations, respectively, and said mechanism comprising:
    (a) a tray comprising:
        (i) a frame adapted to hold substrates for carrying them between said slots and said locations;
        (ii) a lug joined to the top of said frame nearer to one of its laterally opposite sides than the other,
        (iii) a horizontal rod joined to said lug on one transverse side thereof and in vertically spaced relation from said frame,
        (iv) and a tray tab forming a part of said rod which is salient from such lug in the direction opposite the saliency of said elevator tab from said stem and towards said other side of said frame, said tray tab being laterally and transversely offset from said lug and being on its underside of substantially cylindrical form,
    (b) an elevator hook adapted to selectively engage and disengage with such tray and to move said tray vertically when engaged therewith, said hook comprising:
        (i) a downwardly extending dolly arm,
        (ii) a support arm disposed adjacent said dolly arm and extending downward generally parallel thereto, said support arm being pivotally coupled at its upper end to said dolly arm so as to be transversely rockable with respect thereto
        (iii) a vertical stem fixed with, and projecting downward from, the lower end of said support arm,
        (iv) a horizontal elevator bar fixedly joined to said stem on the front side thereof adjacent its bottom, such bar providing as part thereof an elevator tab horizontally salient from said stem, said elevator tab having an upper side laterally and transversely offset from said stem and in which is formed a horizontally extending substantially cylindrical groove adapted to receive and engage with the underside of said tray tab so as to move said tray vertically when said hook is so moved, the cylindrical groove on the top side of said elevator tab having a greater radius than that of the cylindrical surface of the underside of said tray tab so that said groove will tend to retain said tray tab on said elevator tab in the event that said elevator tab becomes displaced from the horizontal,
        (v) tray retaining means fixed to said dolly arm and including a retainer tab extending parallel to said elevator tab in frontwardly spaced relation therefrom, said tray retaining means providing between it and said stem and horizontal elevator bar a transverse gap laterally extending through said hook and adapted when opened wide to pass therethrough said lug of said tray,
        (vi) spring means coupled between said dolly arm and rockable support arm and biasing the latter to urge said elevator bar in a direction which is towards said retainer tab and tending to close said gap therebetween so as to prevent separation between said tray and hook in the event of dislodgement of said tray tab from the upper side of said elevator tab; and
    (c) endless belt conveyor means to which the upper end of said dolly arm of said hook is coupled, said conveyor means being adapted upon engagement of such tray tab with such elevator tab to convey said tray between said stations for purposes of transferring it and any associated substrate between said slots and said cage locations.

2. An elevator mechanism according to claim 1 in which said elevator bar and tray retaining means at the lateral ends thereof away from said tray tab and retainer tab have surfaces on the inner sides thereof which curve transversely towards the outer sides thereof so as to form a flared entrance at those ends for said gap, and in which said lug of said tray is of greater transverse dimension than the size said gap has at the closest approach of said elevator bar and retainer tab, said lug being adapted upon being forced into said flared entrance of said gap to open it up so as to accommodate the full transverse dimension of said lug.

* * * * *